United States Patent
Kamijima

(10) Patent No.: US 7,693,193 B2
(45) Date of Patent: Apr. 6, 2010

(54) LASER LIGHT SOURCE DEVICE, ILLUMINATION DEVICE, MONITOR DEVICE, AND PROJECTOR

(75) Inventor: Shunji Kamijima, Hara-Mura (JP)

(73) Assignee: Seiko Epson Corporation, Tokyo (JP)

( * ) Notice: Subject to any disclaimer, the term of this patent is extended or adjusted under 35 U.S.C. 154(b) by 76 days.

(21) Appl. No.: 11/834,921

(22) Filed: Aug. 7, 2007

(65) Prior Publication Data

US 2008/0080574 A1    Apr. 3, 2008

(30) Foreign Application Priority Data

Sep. 28, 2006   (JP) .............................. 2006-264406

(51) Int. Cl.
    *H01S 3/10*   (2006.01)
(52) U.S. Cl. .......................................... 372/22; 372/21
(58) Field of Classification Search .................... 372/22
    See application file for complete search history.

(56) References Cited

U.S. PATENT DOCUMENTS

| | | | | |
|---|---|---|---|---|
| 5,185,752 A * | 2/1993 | Welch et al. | .................. | 372/22 |
| 5,387,998 A * | 2/1995 | Kitaoka et al. | .............. | 359/328 |
| 5,619,369 A * | 4/1997 | Yamamoto et al. | .......... | 359/332 |
| 5,836,073 A * | 11/1998 | Mizuuchi et al. | ............. | 29/600 |
| 6,987,785 B2 | 1/2006 | Sakata et al. | | |
| 2003/0030919 A1 * | 2/2003 | Pezeshki | ..................... | 359/726 |
| 2004/0114913 A1 * | 6/2004 | Kume | ......................... | 386/125 |
| 2005/0226285 A1 | 10/2005 | Sakata et al. | | |
| 2006/0023173 A1 | 2/2006 | Mooradian et al. | | |
| 2006/0023757 A1 | 2/2006 | Mooradian et al. | | |
| 2006/0268241 A1 | 11/2006 | Watson et al. | | |
| 2006/0280219 A1 | 12/2006 | Shchegrov | | |
| 2007/0041421 A1 * | 2/2007 | Duncan et al. | .............. | 372/106 |
| 2007/0153862 A1 * | 7/2007 | Shchegrov et al. | ..... | 372/50.124 |
| 2007/0153866 A1 | 7/2007 | Shchegrov et al. | | |

FOREIGN PATENT DOCUMENTS

| | | |
|---|---|---|
| JP | A-05-289136 | 11/1993 |
| JP | A-2002-250694 | 9/2002 |
| JP | A-2003-66369 | 3/2003 |
| JP | A-2003-295243 | 10/2003 |
| JP | A-2004-125943 | 4/2004 |
| JP | A-2005-234156 | 9/2005 |

OTHER PUBLICATIONS

A. Mooradian et al., "High Power Extended Vertical Cavity Surface Emitting Diode Lasers and Arrays and Their Applications", Micro-Optics Conference, Tokyo, (Nov. 2, 2005) pp. 1-4.

* cited by examiner

*Primary Examiner*—Minsun Harvey
*Assistant Examiner*—Phillip Nguyen
(74) *Attorney, Agent, or Firm*—Oliff & Berridge, PLC

(57) ABSTRACT

A laser light source device includes: a laser light source that emits a laser light; and an optical wavelength conversion section that includes a ferroelectric material carrying therein a plurality of polarization inversion rows in which a polarization inversion area and a polarization non-inversion area are alternately formed in a predetermined direction, and converts the laser light directed in the predetermined direction into a second harmonic. In the laser light source device, the laser light source is disposed at a fixed position to allow any one of the polarization inversion rows to be positioned on an optical path of the laser light.

15 Claims, 8 Drawing Sheets

LASER LIGHT SOURCE DEVICE, ILLUMINATION DEVICE, MONITOR DEVICE, AND PROJECTOR

BACKGROUND

1. Technical Field

The present invention relates to a laser light source device provided with a laser light source that emits laser lights, and an illumination device, a monitor device, and a projector provided with the laser light source device.

2. Related Art

The technology of wavelength conversion has been knocks by Second Harmonic Generation (SHG) of generating lights whose wavelength is half of any incoming light. Combining the technology of SHG with the technology of a semiconductor laser can implement laser lights in the visible range of wavelength using an easy-to-get semiconductor laser that oscillates in the far infrared range.

Patent Document 1 (JP-A-5-289136) describes the technology being a result of combination as such. With the technology of Patent Document 1, a ferroelectric material is formed thereon with the periodic structure of polarization inversion so that a wavelength conversion element can be manufactured. In the periodic structure of polarization inversion, a polarization inversion area and a polarization non-inversion area are alternately arranged. In the polarization inversion area, the direction of polarization is uniformly directed in the inverse direction, i.e., direction opposite to the direction of spontaneous polarization observed in a ferroelectric crystal, and in the polarization non-inversion area, the direction of polarization remains directed in the direction of spontaneous polarization.

With the previous technology as such, however, there is a difficulty in forming large (mm unit) the polarization inversion area in the plane direction. The current circumstances allow to align the polarization direction in the range of a few hundred μm in the plane direction but the length of the polarization inversion area in the plane direction is very small. On the other hand, due to the high directivity, the laser lights coming from a laser light source often do not pass through the polarization inversion area even after correctly entering a wavelength conversion element. This results in a failure of not being able to generate second harmonics from the wavelength conversion element with high efficiency, thereby failing in achieving high power.

SUMMARY

An advantage of some aspects of the invention is to allow high-power generation of laser lights after wavelength conversion.

The means for making full use of the advantage takes the following configuration.

According to a first aspect of the invention, a first laser light source device includes: a laser light source that emits a laser light; and an optical wavelength conversion section that includes a ferroelectric material carrying therein a plurality of polarization inversion rows in which a polarization inversion area and a polarization non-inversion area are alternately formed in a predetermined direction, and converts the laser light directed in the predetermined direction into a second harmonic. In the first laser light source device, the laser light source is disposed at a fixed position to allow any one of the polarization inversion rows to be positioned on an optical path of the laser light.

With the first laser light source device of the first aspect configured as such, the optical path of laser light never fails to pass one of a plurality of polarization inversion rows provided in the optical wavelength conversion section so that second harmonics can be generated with high efficiency. As such, the first laser light source device of the first aspect of the invention has effects of being able to achieve high power even with laser lights that are through with wavelength conversion.

In the laser light source device of the first aspect configured as such, the laser light source may be plurally provided, and the laser light sources may be disposed at each fixed position to allow any one of the polarization inversion rows to be positioned on the optical path of the laser light.

Also with such a configuration of plurally including the laser light source, the optical path of laser light never fails to pass one of a plurality of polarization inversion rows provided in the optical wavelength conversion section, thereby having effects of being able to achieve high power by generating second harmonics with high efficiency.

The laser light source may be of a surface-emitting type in which the light resonance direction is vertical with respect to a substrate surface.

According to a second aspect of the invention, a second laser light source device includes: a laser array in which a plurality of laser light sources each emitting a laser light are arranged in a first direction regularly with a first spacing; and an optical wavelength conversion section that includes a ferroelectric material carrying therein a plurality of polarization inversion rows in which a polarization inversion area and a polarization non-inversion area are alternately formed in a second direction are arranged in the first direction regularly with a second spacing, and converts each of the laser lights directed in the second direction into a second harmonic. In the second laser light source device, the laser light sources provided in the laser array are disposed at each fixed position to make the first spacing to be an integral multiple of the second spacing.

With the laser light source device of the second aspect configured as such, the laser light sources are disposed at each fixed position, i.e., a first spacing being the distance between any of a plurality of adjacent laser light sources is an integral multiple of a second spacing being the distance between any of a plurality of adjacent polarization inversion rows. This configuration accordingly eases to place a plurality of polarization inversion rows in the optical wavelength conversion section across the optical paths for every laser light coming from the laser light sources. This enables to implement, with ease, generation of second harmonics with high efficiency. The second laser light source device of the second aspect of the invention has effects of being able to achieve the high power even with laser lights that are through with wavelength conversion.

The laser array may be of a surface-emitting type in which the light resonance direction is vertical with respect to a substrate surface.

An illumination device of a third aspect of the invention is provided with the first or second laser light source device. This illumination device can be high in power.

According to a fourth aspect of the invention, a monitor device includes: the first or second laser light source device; and an imaging unit that captures an image of an object exposed to a light by the laser light source device.

This monitor device is capable of exposing an object to lights coming from a high-power laser light source device so that images captured by the imaging unit can be high in brightness.

According to a fifth aspect of the invention, a projector includes: the first or second laser light source device; a light modulation unit that modulates a light emitted From the laser light source device in accordance with an image signal; and a projection unit that projects an image formed by the light modulation unit.

This projector is allowed to include a high-power laser light source device so that images of high brightness can be displayed thereon.

BRIEF DESCRIPTION OF THE DRAWINGS

The invention will be described with reference to the accompanying drawings, wherein like numbers reference like elements.

DESCRIPTION OF EXEMPLARY EMBODIMENTS

In the below, embodiments of the invention are described.

1. First Embodiment

A. Entire Device Configuration

Figure 1:
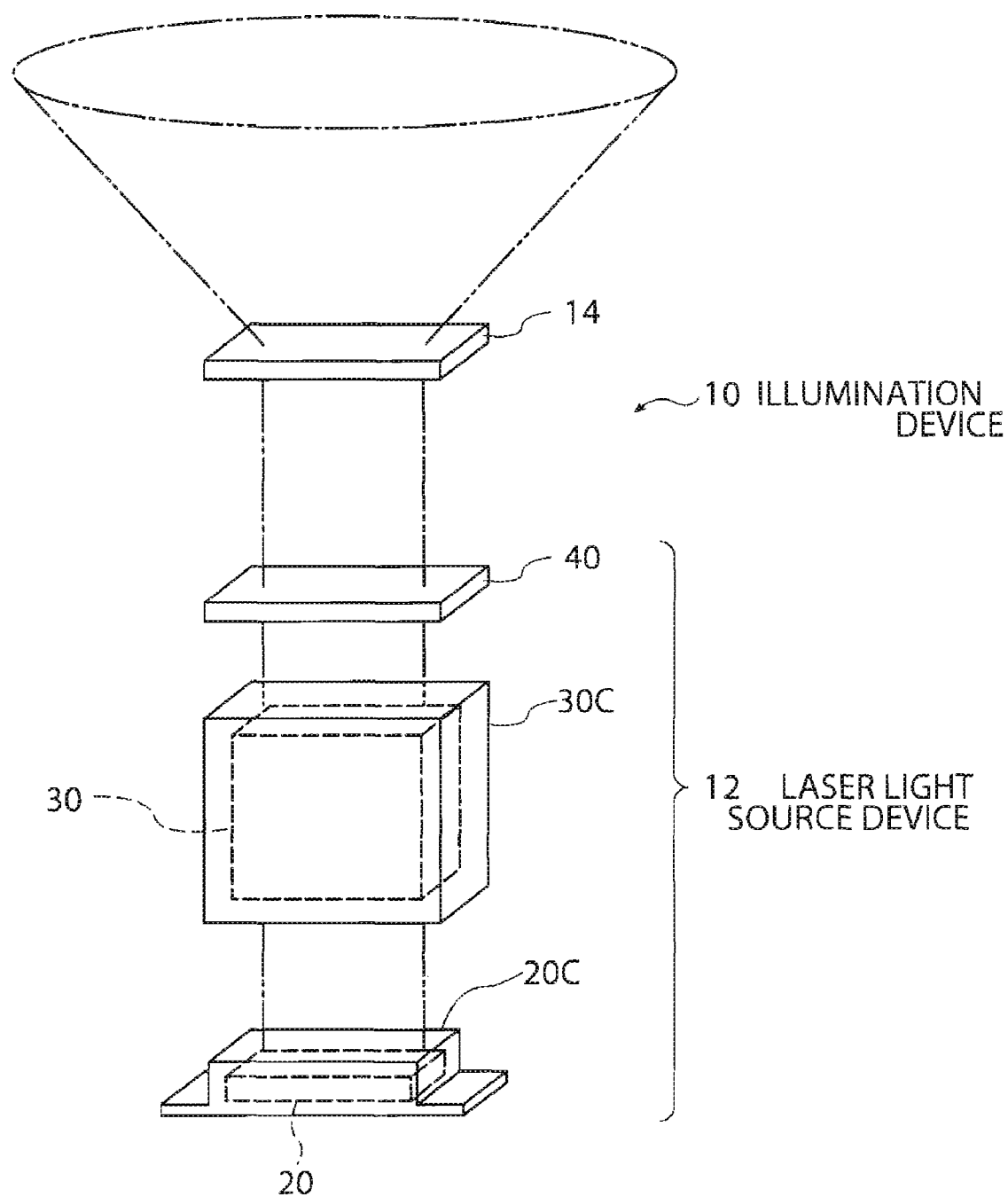
FIG. 1 is a diagram showing the schematic configuration of an illumination device 10 as a first embodiment of the invention.

FIG. 1 is a diagram showing the schematic configuration of an illumination device 10 as a first embodiment of the invention. As shown in the drawing, the illumination device 10 is configured to include a laser light source device 12 corresponding to the "laser light source device" of the aspects of the invention, and a diffusion element 14 that diffuses laser lights coming from the laser light source device 12. The laser light source device 12 is configured to include a laser cell 20C carrying therein a semiconductor laser array 20, a jacket 30C carrying therein an optical wavelength conversion element 30, and a reflective mirror 40 serving as an external optical resonator. The jacket 30C is provided with a Peltier element for temperature control use together with a thermistor so that the temperature of the optical wavelength conversion element 30 can be controlled with high accuracy. Note here that as an alternative to the Peltier element, any other heat generation units will also do.

B. Configuration of Main Part

Figure 2:
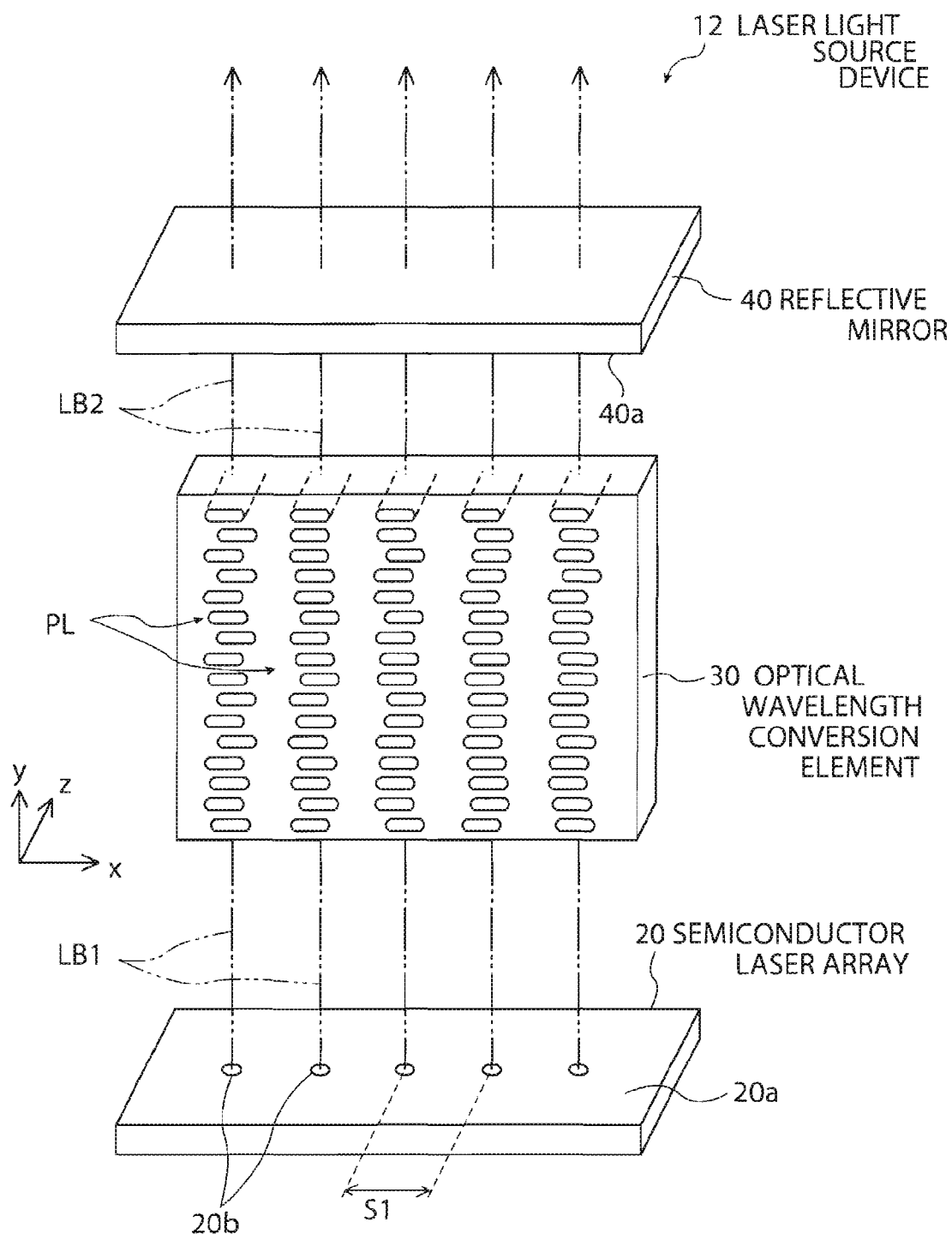
FIG. 2 is a diagram showing the main part of a laser light source device 12.

FIG. 2 1s a diagram snowing the main part of the laser light source device 12. As described in the foregoing, the laser light source device 12 is configured to include the semiconductor laser array 20, the optical wavelength conversion element 30, and the reflective mirror 40. In the semiconductor laser array 20, the light resonant direction is vertical with respect to the substrate surface, and is called VCSEL (Vertical-Cavity Surface-Emitting Laser) in which laser lights are directed vertical to a substrate surface 20a. The semiconductor laser array 20 is of a one-dimensional array structure carrying therein a row of a plurality of light-emitting layers, i.e., active layers, 20b. These light-emitting layers 20b are corresponding to the "laser light sources" of the aspects of the invention. FIG. 2 example is snowing five light-emitting layers 20b but this is surely not restrictive, and any number will also do. In FIG. 2 example, the array structure is defined by placement directions, i.e., coordinate axes of x, y, and z. That is, the light-emitting layers 20b are aligned in the x-axis direction, i.e., first direction, and laser lights LB1 from the light-emitting layers 20b are directed in the y-axis direction, i.e., second direction. The direction vertical to both the x- and y-axes directions is the z-axis direction. These coordinate axes are referred to in the below whenever required.

In this embodiment, the distance between any adjacent light-emitting layers 20b is fixed, i.e., first spacing S1. Note here that the light-emitting layers 20b are not necessarily arranged systematically at regular spacings, and may be arranged at varying spacings.

The optical wavelength conversion element 30 causes a phenomenon of second harmonic generation (SHG), i.e., a second-order nonlinear optical phenomenon of converting two photons into one photon that oscillates twice as frequent. The optical wavelength conversion element 30 is configured by a ferroelectric material formed with the polarization inversion structure.

Figure 3:
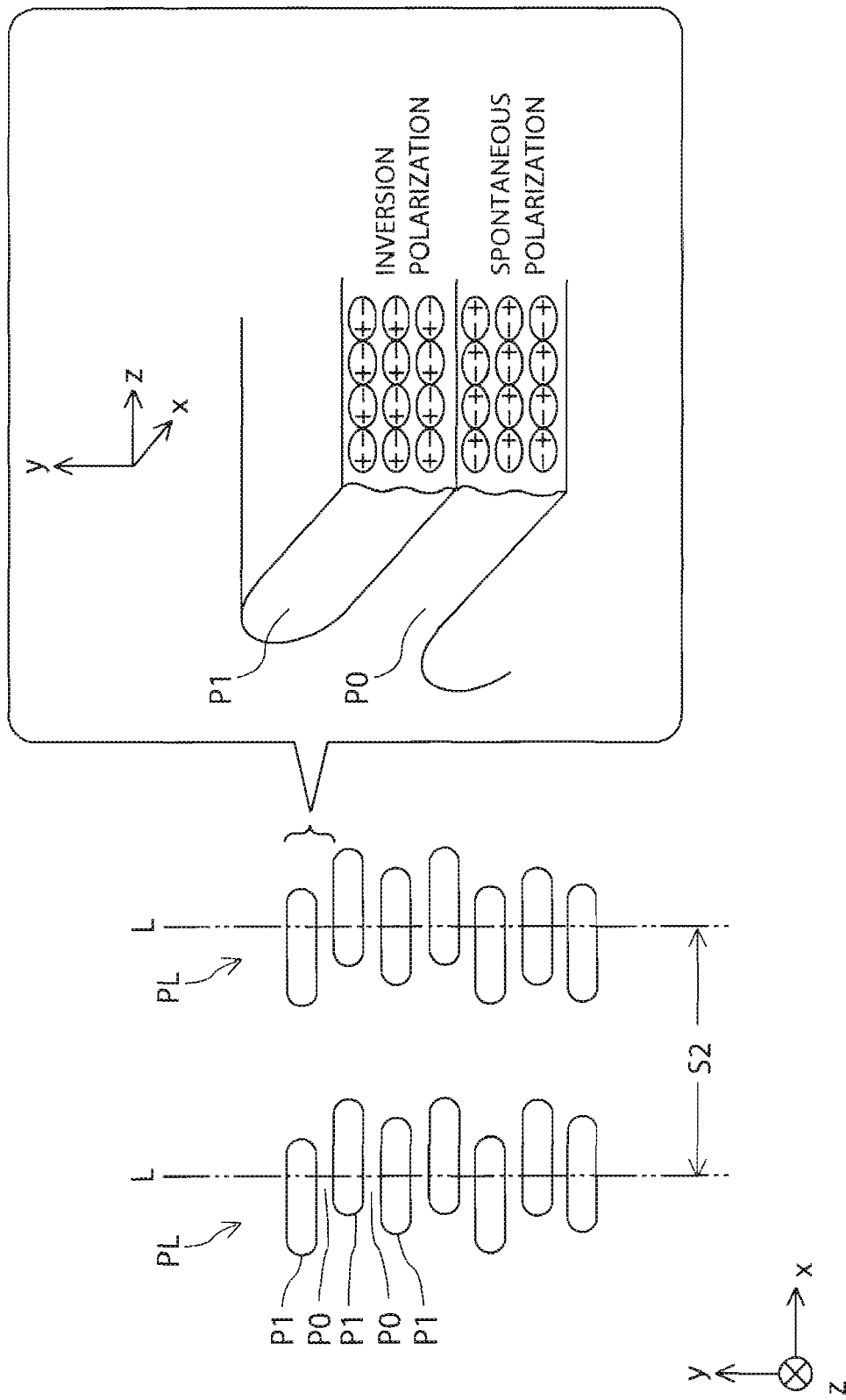
FIG. 3 is a diagram schematically showing the polarization inversion structure formed in an optical wavelength conversion element 30.

FIG. 3 is a diagram schematically showing the polarization inversion structure. As shown in the drawing, the polarization inversion structure includes a plurality of polarization inversion rows PL, in each of which a polarization inversion area P1 and a polarization non-inversion area P0 are alternately formed. In the polarization inversion area P1, the direction of spontaneous polarization in a ferroelectric crystal is reversed, and in the polarization non-inversion area P0, such a direction is not reversed. The row direction of the polarization inversion rows PL, i.e., the direction along which the polarization inversion areas P1 and the polarization non-inversion areas P0 are alternately arranged, is the same as the y-axis direction described above, i.e., the emission direction of the laser lights LB1 coming from the semiconductor laser array 20. Note here that the polarization inversion areas P1 are all going through in the depth direction, i.e., z-axis direction in the drawing.

The polarization inversion structure is formed by electric field application with an element of lithium niobate or lithium tantalate. This is surely not the only possibility of forming the polarization inversion structure, and any others will also do, e.g., polarization inversion with ion exchange, and microdomain inversion using electron beams. The material is also not restrictive to lithium niobate and lithium tantalite, and any material considered appropriate may be used for any selected method.

As shown in the drawing, the polarization inversion areas P1 are each extended in the lateral direction, i.e., x-axis direction, and the lateral width is not always the same. In one polarization inversion row PL, the polarization inversion areas P1 are not all positioned the same in the x-axis direction, and some displacement is observed thereamong. However, the polarization inversion areas P1 in one polarization inversion row PL are at least positioned on a line L so that a row is formed thereby. The polarization inversion row PL configured as such is plurally disposed n the x-axis direction, i.e., toward one of the placement directions of the array structure of the semiconductor laser array 20.

The relative positional relationship is defined between the light-emitting layers 20b of the semiconductor laser array 20 and the optical wavelength conversion element 30 in such a manner that the optical paths for the laser lights LB1 coming from the light-emitting layers 20b of the semiconductor laser array 20 never fail to each pass through one of the lines L assumed for a plurality of polarization inversion rows PL. That is, the relative positional relationship between the light-emitting layers 20b and the optical wavelength conversion element 30 is so defined that the optical path for each of the laser lights LB1 never fail to pass through one of a plurality of polarization inversion rows PL. Note that; in this embodiment, the polarization inversion rows PL are provided as many as the light-emitting layers 20b of the semiconductor laser array 20, and the light-emitting layer 20b has a one-to-one relationship with the polarization inversion row PL.

In this embodiment, the distance between any adjacent polarization inversion rows PL is fixed, i.e., second spacing S2. The second spacing S2 is equal to the first spacing S being the distance between any adjacent light-emitting layers 20b of the semiconductor laser array 20. The second spacing S2 is specifically in the range from 10 to 200 [μm]. For reference purposes, the polarization inversion areas P1 configuring the polarization inversion row PL each have the lateral width of several hundred [μm]. Note that the polarization inversion row PL is not necessarily formed at regular spacings, and may be formed at varying spacings. If this is the case, the spacing has to be the same as the corresponding spacing between the light-emitting layers 20b of the semiconductor laser array 20.

The reflective mirror 40 is specially coated on a surface 40a on the side of the optical wavelength conversion element 30. With this special coating, the reflective mirror 40 shows high reflection against excitation lights generated by the semiconductor laser array 20, and shows high transmission against second harmonics generated by the optical wavelength conversion element 30. On the other hand, the semiconductor laser array 20 is specially coated on the substrate surface 20a on the light emission side. With this special coating, the semiconductor laser array 20 shows high transmission against the excitation lights, and shows high reflection against the second harmonics. With such a configuration, the substrate surface 20a of the semiconductor laser array 20 and the surface 40a of the reflective mirror 40 form an optical resonator. This optical resonator traps therein laser lights coming from the semiconductor laser array 20, and the laser lights thus pass through the optical wavelength conversion element 30 for multiple times. As described above, because the optical wavelength conversion element 30 is under the temperature control with high accuracy by a Peltier element, the resulting second harmonics can be with less noise. The second harmonics LB2 pass through the reflective mirror 40, and are emitted from the laser light source device 12 as wavelength-converted laser lights.

C. Effect and Advantages

With the laser light source device 12 configured as such for provision in the illumination device 10, the relative positional relationship is defined between the light-emitting layers 20b and the optical wavelength conversion element 30 in such a manner that the optical paths for the laser lights LB1 never fail to each pass through one of the polarization inversion rows PL. The second harmonics can be thus generated with high efficiency. The laser light source device 12 can be of thus high power even with laser lights to be emitted therefrom are those through with wavelength conversion by the optical wavelength conversion element 30. This thus favorably allows the illumination device 10 to be high in power.

With the laser light source device 112 of this embodiment, the light-emitting layers 20b of the semiconductor laser array 20 are each defined by position in such a manner that the first spacing S1 being the distance between any adjacent light-emitting layers 20b of the semiconductor laser array 20 becomes equal to the second spacing S2 being the distance between any adjacent polarization inversion rows PL of the optical wavelength conversion element 30. This configuration accordingly eases to place a plurality of polarization inversion rows PL across the optical paths for the laser lights LB1 coming from the semiconductor laser array 20, thereby implementing, with ease, generation of second harmonics with high efficiency.

D. Modified Example

Described next is a modified example of the first embodiment described above.

Figure 4:
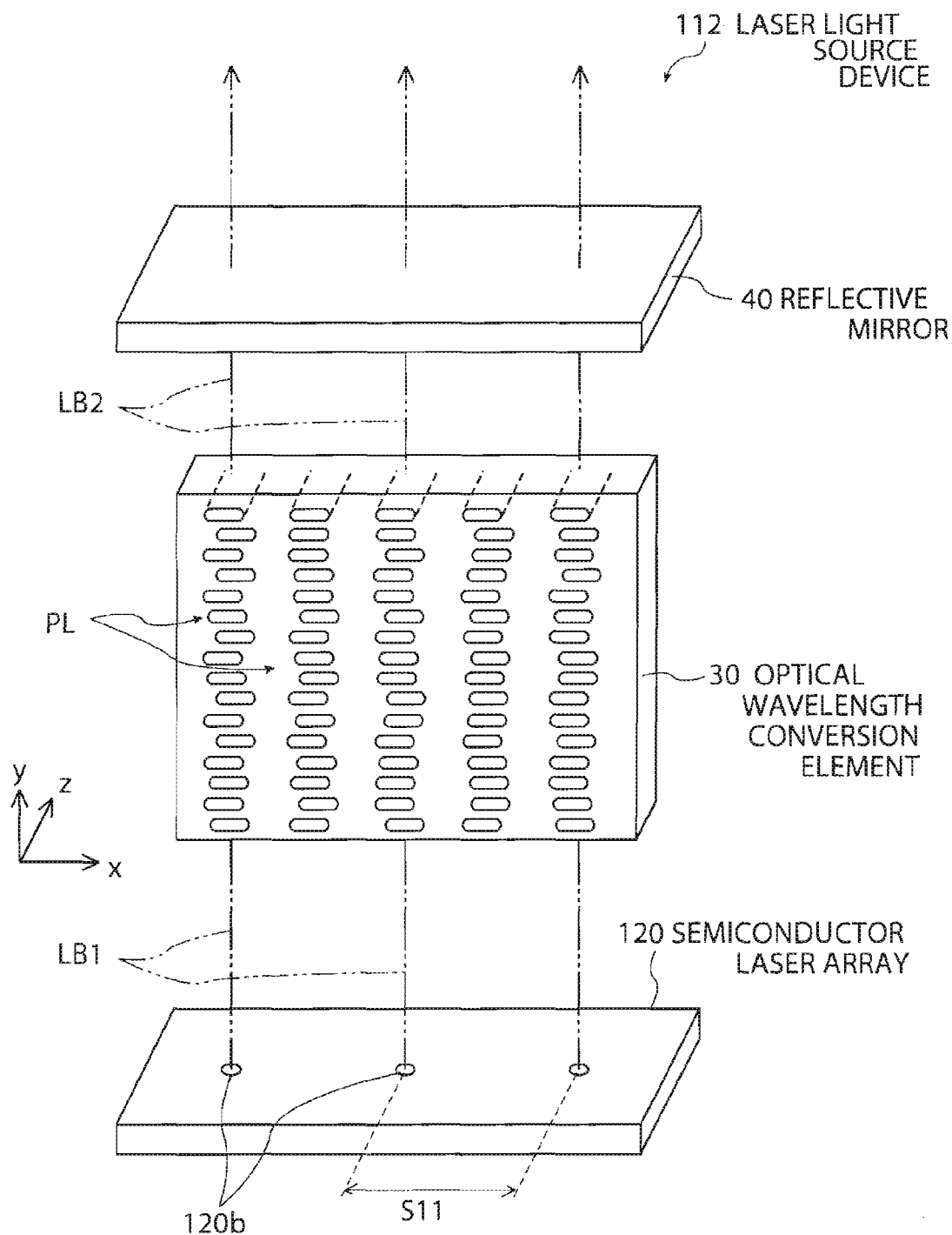
FIG. 4 is a diagram showing the main part of a laser light source device 112 provided to an illumination device as a first modified example of the first embodiment.

FIG. 4 is a diagram showing the main part of a laser light source device 112 equipped in an illumination device as a first modified example. This laser light source device 112 can be used as an illumination device similarly to the first embodiment. As shown in FIG. 4, the laser light source device 112 is configured to include a semiconductor laser array 120, the optical wavelength conversion element 30, and the reflective mirror 40. The optical wavelength conversion element 30 and the reflective mirror 40 are the same as those in the first embodiment, and are thus under the same reference numerals.

Compared with the semiconductor laser array 20 in the first embodiment, a difference lies in that the semiconductor laser array 120 includes a less number of light-emitting layers 120b, i.e., three. The semiconductor laser array 120 is also a VCSEL, and has the same placement directions of the array structure and the emission direction of the laser lights LB1, for example. A first spacing S11 being the distance between any adjacent light-emitting layers 120b is twice as large as the first spacing S1 in the first embodiment. This means that the first spacing S11 being the distance between any adjacent light-emitting layers 20b of the semiconductor laser array 20 is twice as large as the second spacing S2 being the distance between any adjacent polarization inversion rows PL formed in the optical wavelength conversion element 30.

In the laser light source device 112 of the first modified example configured as such, the relative positional relationship is defined between the light-emitting layers 120b and the optical wavelength conversion element 30 in such a manner that the optical paths for the laser lights LB1 never fail to each pass through one of the polarization inversion rows PL. Similarly to the laser light source device 12 of the first embodiment, the second harmonics can be thus generated with high efficiency. The laser light source device 112 can be thus of high power even with laser lights to be emitted therefrom are those through with wavelength conversion.

With the laser light source device 112 of the first modified example, the light-emitting layers 120b of the semiconductor laser array 120 are each defined by position in such a manner that the first spacing S11 being the distance between any adjacent light-emitting layers 120b of the semiconductor laser array 120 becomes twice as large as the second spacing s2 being the distance between any adjacent polarization inversion rows PL of the optical wavelength conversion element 30. This configuration accordingly eases to place a plurality of polarization inversion rows PL across the optical paths for the laser lights LB1 coming from the semiconductor laser array 120, thereby implementing, with ease, generation of second harmonics with high efficiency.

As another modification of this first modified example, the light-emitting layers 20b of the semiconductor laser array 20 may be each defined by position in such a manner that the first spacing S1 is an integral multiple of the second spacing S2, i.e., triple, four times, and five times. With this being the configuration, the second harmonics can be generated with high efficiency similarly to the first modified example.

Figure 5:
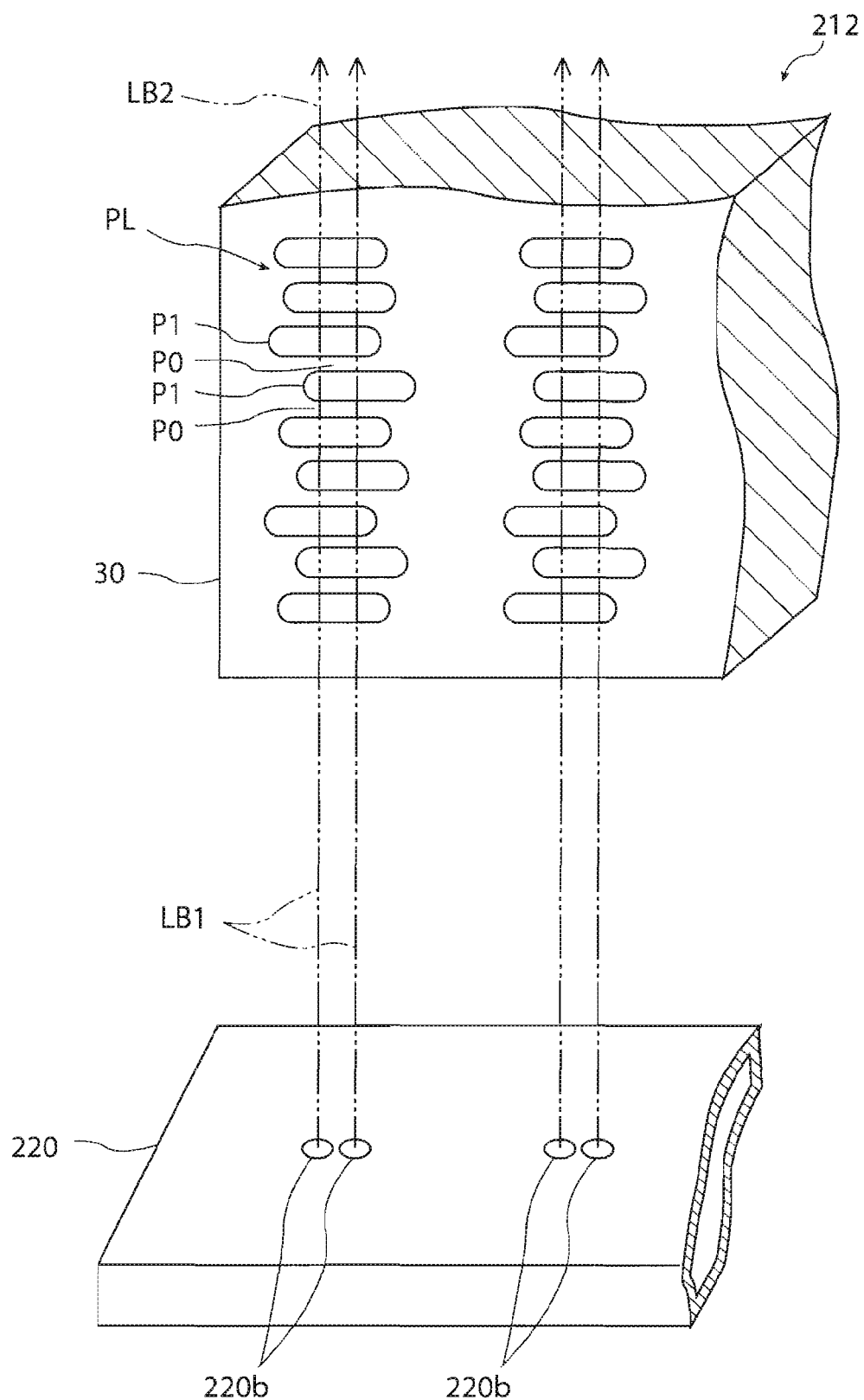
FIG. 5 is a diagram showing a main part of a laser light source device 212 provided to an illumination device as a second modified example of the first embodiment.

FIG. 5 is a diagram showing a part of a laser light source device 212 equipped in an illumination device as a second modified example of the first embodiment. This laser light source device 212 can be used as an illumination device similarly to the first embodiment. As shown in FIG. 5, the laser light source device 212 is configured to include a semiconductor laser array 220, the optical wavelength conversion element 30, and a reflective mirror (not shown) The optical wavelength conversion element 30 and the reflective mirror are the same as those in the first embodiment.

Compared with the semiconductor laser array 20 in the first embodiment, a difference lies in that the semiconductor laser array 220 includes a larger number of light-emitting layers 220b, and the light-emitting layers 220b are in pairs. The semiconductor laser array 220 is also a VCSEL, and has the same placement directions of the array structure and the emission direction of the laser lights LB1, for example. The light-emitting layers 220b of the semiconductor laser array 220 are each defined by position in such a manner that one of a plurality of polarization inversion rows PL formed in the optical wavelength conversion element 30 is located on an optical path for two laser lights coming from the light-emitting layers 220b in pairs.

With the laser light source device 212 of the second modified example configured as such, the light-emitting layers 220b of the semiconductor laser array 220 are each defined by position in such a manner that the optical paths for the laser lights LB1 emitted from the light-emitting layers 220b never fail to each pass through one of the polarization inversion rows PL. The laser light source device 212 can thus generate second harmonics with high efficiency similarly to the laser light source device 12 of the first embodiment. As such, the laser light source device 212 has effects of being able to achieve high power even with laser lights to be emitted therefrom are those through with wavelength conversion by the optical wavelength conversion element 30.

Figure 6:
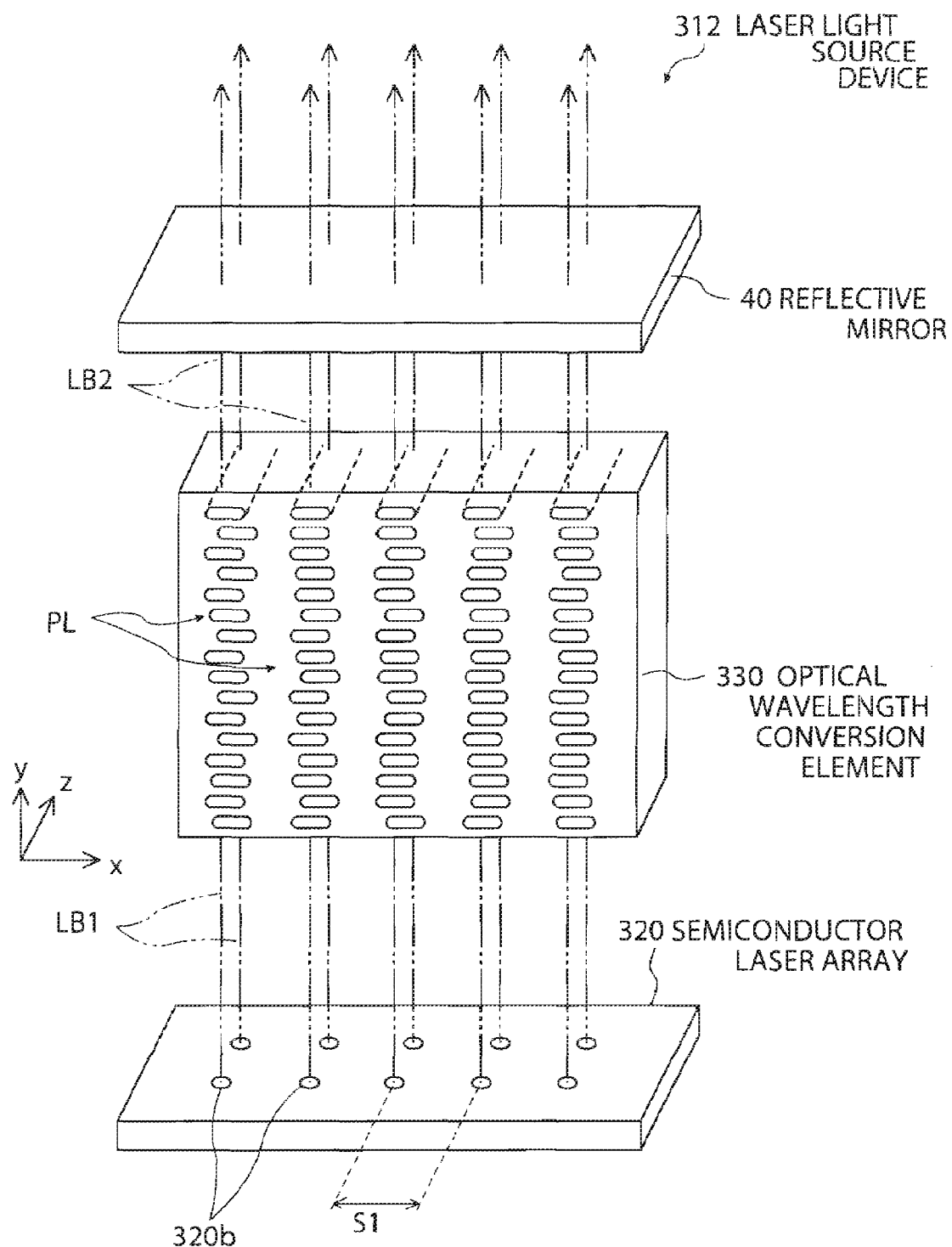
FIG. 6 is a diagram showing the main part of a laser light source device 312 provided to an illumination device as a third modified example of the first embodiment.

FIG. 6 is a diagram showing the main part of a laser light source device 312 equipped in an illumination device as a third modified example of the first embodiment. This laser light source device 312 can be used as an illumination device similarly to the first embodiment. As shown in FIG. 6, the laser light source device 312 is configured to include a semiconductor laser array 320, an optical wavelength conversion device 330, and the reflective mirror 40. The reflective mirror is the same as that in the first embodiment, and is thus provided with the same reference numeral.

Compared with the semiconductor laser array 20 in the first embodiment, a difference of the semiconductor laser array 320 lies in the two-dimensional array structure in which light-emitting layers 320b are arranged in two rows. The semiconductor laser array 320 is also a VCSEL, and has the emission directions of the laser lights LB1, for example. In the semiconductor laser array 320, five of the light-emitting layers 320b are arranged in the x-axis direction at regular intervals, and two of the resulting row are arranged in the z-axis direction. The first spacing S1 being the distance between any adjacent light-emitting layers 320b in the x-axis direction is the same as that in the first embodiment. It means that the first spacing S1 being the distance between any adjacent light-emitting layers 320b in the row direction of the semiconductor laser array 320 is the same as the second spacing S2 being the distance between any adjacent polarization inversion rows PL formed in the optical wavelength conversion element 30.

Compared with the optical wavelength conversion element 30 in the first embodiment, the optical wavelength conversion device 330 is slightly thicker in the z-axis direction, and the remaining configuration is the same. Note that the polarization inversion areas formed in the optical wavelength conversion element 330 are the same as those in the first embodiment, and are going through in the depth direction, i.e., z-axis direction in the drawing, with the same size and position in the plane direction. It thus means that the second spacing S2 being the distance between any adjacent polarization inversion rows PL formed in the optical wavelength conversion element 30 is the same as the first spacing S1 being the distance between any adjacent light-emitting layers 20b in the x-axis direction of the semiconductor laser array 20.

With the laser light source device 312 of the third modified example configured as such, the relative positional relationship is defined between the light-emitting layers 120b and the optical wavelength conversion element 30 in such a manner that the optical paths for the laser lights LB1 emitted from the light-emitting layers 320b arranged in two rows never fail to each pass through one of the polarization inversion rows PL. The laser light source device 312 can thus generate second harmonics with high efficiency similarly to the laser light source device 12 of the first embodiment. As such, the laser light source device 312 has effects of being able to achieve high power even with laser lights to be emitted therefrom are those through with wavelength conversion.

Also in the laser light source device 312 of this embodiment, the light-emitting layers 320b of the semiconductor laser array 320 are each defined by position in such a manner that the first spacing S1 being the distance between any adjacent light-emitting layers 20b of the semiconductor laser array 320 in the x-axis direction becomes equal to the second spacing S2 being the distance between any adjacent polarization inversion rows PL of the optical wavelength conversion element 330. This configuration accordingly eases to place a plurality of polarization inversion rows PL across the optical paths for the laser lights LB1 coming from the semiconductor laser array 20, thereby implementing, with ease, generation of second harmonics with high efficiency.

Note that, as still another modification of the third modified example, similarly to the relationship between the first embodiment and the first modified example, the light-emitting layers 320b of the semiconductor laser array 320 may be each defined by position in such a manner that the first spacing S1 may be an integral multiple of the second spacing S2, i.e., double, triple, four times, and five times. The two-dimensional array structure of the semiconductor laser array 320 is also not restrictive, and the structure may take any other number of rows, i.e., three or four.

2. Second Embodiment

Described next is a second embodiment of the invention.

Figure 7:
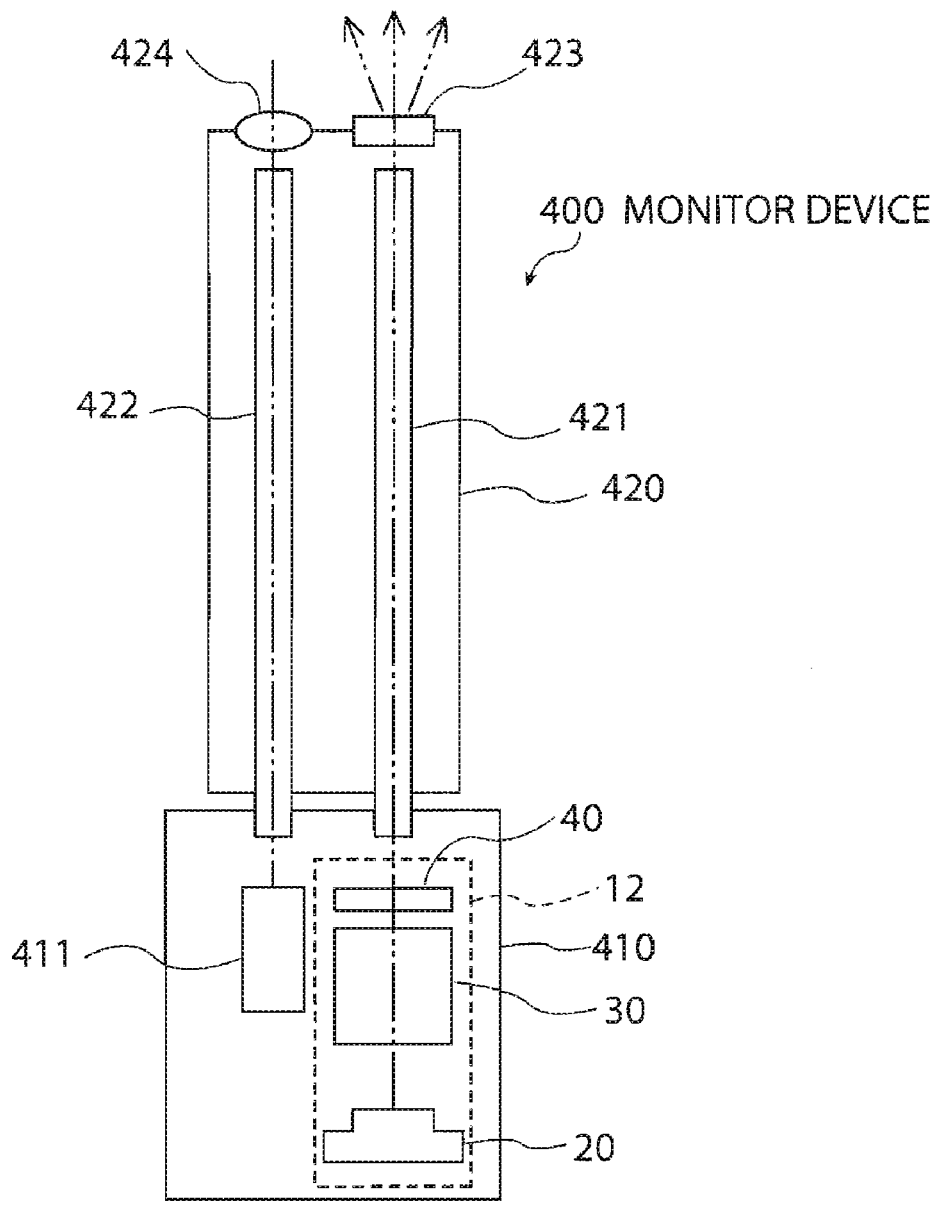
FIG. 7 is a diagram showing the schematic configuration of a monitor device 400 as a second embodiment of the invention.

FIG. 7 is a diagram showing the schematic configuration of a monitor device 400 of the second embodiment of the invention. The monitor device 400 is configured to include a device body 410 and a light transmission section 420. The device body 410 is provided with the above-described laser light source device 12 of the first embodiment. As described in the first embodiment, the laser light source device 12 is configured to include the semiconductor laser array 20, the optical wavelength conversion element 30, and the reflective mirror 40.

The light transmission section 420 is configured to include two light guides 421 and 422 on the light transmission and reception sides, respectively. These light guides 421 and 422 are each a bundle of a plurality of luminous fluxes, and serve to direct the laser lights to the area located far away. On the light entering side of the light guide 421, on the light transmission side, the laser light source device 12 is disposed, and on the light exit side thereof, a light diffusion plate 423 is disposed. The laser lights emitted from the laser light source device 12 pass through the light guide 421, and then are directed to the light diffusion plate 423 at the tip end of the light transmission section 420. The laser lights are thus diffused by the light diffusion plate 423 so that an object is exposed thereby.

The light transmission section 420 is also provided, at the tip end, with an image forming lens 424, which receives reflected lights coming from the object. The reflected lights pass through the light guide 422 on the light reception side, and then are directed to a camera 411 being an imaging unit provided inside of the device body 410. As such, the camera 411 can capture an image based on the reflected lights being the results of exposing the object by the laser lights coming from the laser light source device 12.

With the monitor device 400 configured as such, the laser light source device 12 of high power exposes an object with laser lights so that the resulting image captured by the camera 411 can be high in brightness.

As a modified example of the second embodiment, alternatively, the laser light source device 12 provided inside of the device body 410 may be changed to those of the first to third modified examples of the first embodiment.

3. Third Embodiment

Described next is a third embodiment of the invention.

Figure 8:
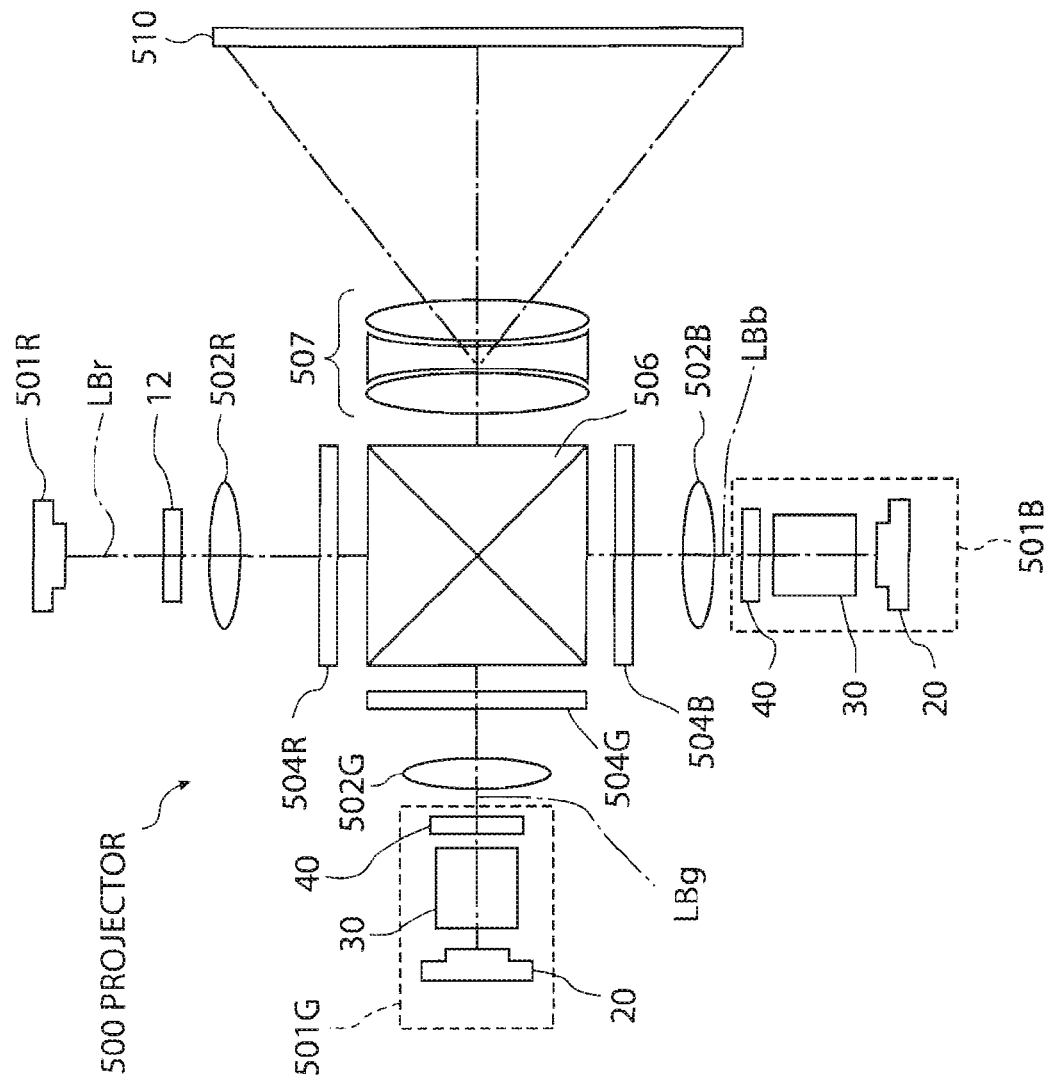
FIG. 8 is a diagram showing the schematic configuration of a projector 500 as a third embodiment of the invention.

FIG. 8 is a diagram showing the schematic configuration of a projector 500 as the third embodiment of the invention. The drawing shows no cabinet configuring the projector 500 for the sake of brevity. The projector 500 is configured to include a red laser light source device 501R that emits red lights, a green laser light source device 501G that emits green lights, and a blue laser light source device 501B that emits blue lights.

The red laser light source device 501R is a general semiconductor laser array that emits red laser lights LBb. The green laser light source device 501G is of the same configuration as the laser light source device 12 of the first embodiment described above, and is configured to include the semiconductor laser array 20, the optical wavelength conversion element 30, and the reflective mirror 40. This optical wavelength conversion element 30 has been subjected to wavelength conversion to emit laser lights LBg of green wavelength. The blue laser light source device 501B is of the same configuration as the laser light source 12 of the first embodiment described above, and is configured to include the semiconductor laser array 20, the optical wavelength conversion element 30, and the reflective mirror 40. This optical wavelength conversion element 30 has been subjected to wavelength conversion to emit laser lights LBb of blue wavelength.

The projector 500 is configured to include liquid crystal light valves (light modulation unit) 504R, 504G, and 504B, a cross dichroic prism (color light combination unit) 506, and a projection lens (projection unit) 507. The liquid crystal light valves 504R, 504G, and 504B each modulate laser lights LBr, LBg, and LBb varying in color coming from the laser light source devices 501R, 501G, and 501B in accordance with an image signal coming from a personal computer or others. The cross dichroic prism 506 combines the lights coming from the liquid crystal light valves 504R, 504G, and 504B, and guides the result to the projection lens 507. The projection lens 507 increases the size of the images formed by the liquid crystal light valves 504R, 504G, and 504B, and projects the resulting images on a screen 510.

For the aim of making illumination distribution uniform for the laser lights coming from the laser light source devices 501R, 501G, and 501B, the projector 500 includes distribution-uniform systems 502R, 502G, and 502B in the downstream of the optical path from the laser light source devices 501R, 501G, and 501B. The resulting lights whose illumination distribution is uniformed thereby accordingly illuminate the liquid crystal light valves 504R, 504G, and 504B. The distribution-uniform systems 502R, 502G, and 502B are each configured by a hologram or a field lens, for example.

The color lights being the modulation results of the liquid crystal light valves 504R, 504G, and 504B are directed into the cross dichroic prism 506. This prism is made of four right-angle prisms attached together, and on the internal surface, two dielectric multilayer films are formed in the shape of a letter X. One of the dielectric multilayer films reflects red lights, and the remaining dielectric multilayer film reflects blue lights. With these dielectric multilayer films, three color lights are combined together so that a light of a color image is formed. The light being the combination result is projected on the screen 510 by the projection lens 507 being the projection system, and the screen 507 accordingly displays thereon the image increased in size.

With the projector 500 configured as such, the high-power laser light source devices 501G and 501B can be used, thereby enabling to display images of high brightness.

As a modified example of the third embodiment, alternatively, the green laser light source device 501G and/or the blue laser light source device 501B may be changed to those of the first to third modified examples of the first embodiment.

4. Another Embodiment

While the invention has been described in detail, the foregoing embodiments and modified examples are in all aspects illustrative and not restrictive. It is understood that numerous other modifications and variations can be devised without departing from the scope of the invention.

1. In the first embodiment, exemplified is the semiconductor laser array 20 in which a plurality of light-emitting layers, i.e., laser light sources, are arranged. Alternatively, the configuration may include only one laser light source with one light-emitting layer. With this being the case, the optical path of the laser light source may be disposed to any one of a plurality of polarization inversion rows PL formed in the optical wavelength conversion element 30.

2. In the above embodiments, exemplified is the laser array of a VCSEL type. Alternatively, the configuration may include a laser array of an edge-emitting type, in which the light resonance direction is parallel to the substrate surface. As an alternative to the semiconductor laser, the laser light source may be of other types, e.g., solid-state laser, liquid laser, gas laser, and free electron laser.

In the above embodiments, the optical wavelength conversion element 30 is an SHG element in which the polarization inversion areas P1 are going through in the depth direction. Alternatively, an SHG element of an optical waveguide type will do with an optical waveguide on the substrate. With this being the case, the laser light source may be defined by position in such a manner that the optical paths for laser lights are located on the portion of optical waveguide above the polarization inversion rows formed to the ferroelectric substrate.

4. The projector 500 of the third embodiment is a so-called three-panel liquid crystal projector. Alternatively, a liquid crystal projector may be of a single panel capable of color display only with a single light valve by illuminating a laser light source device in a time sharing manner on a color basis.

The entire disclosure of Japanese Patent Application No. 2006-264406, filed Sep. 28, 2006 is expressly incorporated by reference herein.

What is claimed is:

1. A laser light source device, comprising:
a laser light source that emits a laser light; and
an optical wavelength conversion section that includes a ferroelectric material carrying therein a plurality of polarization inversion rows in which a polarization inversion area and a polarization non-inversion area are alternately formed in a predetermined direction out of alignment with respect to each other in the predetermined direction, and converts the laser light directed in the predetermined direction into a second harmonic, wherein
the plurality of polarization inversion rows are arranged at intervals in a direction that is perpendicular to the predetermined direction,
the laser light source is disposed at a fixed position to allow any one of the polarization inversion rows to be positioned on an optical path of the laser light, and
the polarization inversion areas are positioned such that the laser light passing through the polarization inversion row passes through at least a portion of each polarization inversion area.

2. The laser light source device according to claim 1, wherein
the laser light source is one of a plurality of laser light sources, and
the laser light sources are disposed at each fixed position to allow any one of the polarization inversion rows to be positioned on the optical path of the laser light.

3. The laser light source device according to claim 1, wherein
the laser light source is of a surface-emitting type in which a light resonance direction is vertical with respect to a substrate surface.

4. A laser light source device, comprising:
a laser array in which a plurality of laser light sources each emitting a laser light are arranged in a first direction regularly with a first spacing; and
an optical wavelength conversion section that includes a ferroelectric material carrying therein a plurality of polarization inversion rows in which a polarization inversion area and a polarization non-inversion area are alternately formed in a second direction are arranged in the first direction regularly with a second spacing, and converts each of the laser lights directed in the second direction into a second harmonic, wherein
the plurality of polarization inversion rows are arranged at intervals in a direction that is perpendicular to the predetermined direction,
the laser light sources provided in the laser array are disposed at each fixed position to make the first spacing to be an integral multiple of the second spacing,
the polarization inversion areas are positioned such that the laser light passing through the polarization inversion row passes through at least a portion of each polarization inversion area, and
the polarization inversion areas are out of alignment in the second direction.

5. The laser light source device according to claim 4, wherein
the laser array is of a surface-emitting type in which a light resonance direction is vertical with respect to a substrate surface.

6. An illumination device comprising the laser light source device of claim 1.

7. A monitor device, comprising:
the laser light source device of claim 1; and
an imaging unit that captures an image of an object exposed to a light by the laser light source device.

8. A projector, comprising:
the laser light source device claim 1;
a light modulation unit that modulates a light emitted from the laser light source device in accordance with an image signal; and
a projection unit that projects an image formed by the light modulation unit.

9. The laser light source device according to claim 1, wherein the polarization inversion areas are discrete units.

10. The laser light source device according to claim 4, wherein the polarization inversion areas are discrete units.

11. The laser light source device according to claim 1, further comprising a reflective mirror positioned directly following the optical path of the optical wavelength conversion section for transmitting second harmonic light and reflecting an excitation light.

12. The laser light source device according to claim 4, further comprising a reflective mirror positioned directly following the optical path of the optical wavelength conversion section for transmitting second harmonic light and reflecting an excitation light.

13. The laser light source device according to claim 1, the plurality of polarization inversion rows having a plurality of polarization inversion areas and a plurality of polarization non-inversion areas alternatively formed therein, the plurality of polarization areas being out of alignment with respect to each other in the predetermined direction, and being positioned such that at least one laser light propagating in the predetermined direction would pass through each of the plurality of polarization inversion sections.

14. The laser light source device of claim 4, the plurality of polarization inversion rows having a plurality of polarization inversion areas and a plurality of polarization non-inversion areas alternatively formed therein, the plurality of polarization areas being out of alignment with respect to each other in the second direction, and being positioned such that at least one laser light propagating in the second direction would pass through each of the plurality of polarization inversion sections.

15. The laser light source device of claim 4, wherein the integral multiple is at least 2, such that the first spacing is at least twice the second spacing and laser light does not pass through at least one polarization inversion row.

* * * * *